(12) United States Patent
Tzeng

(10) Patent No.: US 6,558,742 B1
(45) Date of Patent: May 6, 2003

(54) METHOD OF HOT-FILAMENT CHEMICAL VAPOR DEPOSITION OF DIAMOND

(75) Inventor: Yonhua Tzeng, Auburn, AL (US)

(73) Assignee: Auburn University, Auburn, AL (US)

( * ) Notice: Subject to any disclaimer, the term of this patent is extended or adjusted under 35 U.S.C. 154(b) by 0 days.

(21) Appl. No.: 09/502,065

(22) Filed: Feb. 10, 2000

Related U.S. Application Data
(60) Provisional application No. 60/119,753, filed on Feb. 10, 1999.

(51) Int. Cl.$^7$ .................................................. C23C 16/26
(52) U.S. Cl. ........................ 427/249.8; 427/249.11; 427/255.11; 427/255.23
(58) Field of Search .................... 427/249.8, 249.11, 427/255.11, 255.23

(56) References Cited

U.S. PATENT DOCUMENTS

| | | | |
|---|---|---|---|
| 4,174,380 A | 11/1979 | Strong et al. ............... | 423/446 |
| 5,112,775 A * | 5/1992 | Iida et al. | |
| 5,114,745 A | 5/1992 | Jones ......................... | 427/113 |
| 5,202,156 A | 4/1993 | Yamamoto et al. .......... | 427/135 |
| 5,236,545 A | 8/1993 | Pryor .......................... | 156/613 |
| 5,270,077 A | 12/1993 | Knemeyer et al. .......... | 427/249 |
| 5,364,423 A | 11/1994 | Bigelow et al. .............. | 51/293 |
| 5,382,274 A | 1/1995 | Yamamoto et al. ............ | 65/26 |
| 5,403,619 A | 4/1995 | Cuomo et al. ............... | 427/248 |
| 5,451,430 A | 9/1995 | Anthony et al. .......... | 427/372.2 |
| 5,468,326 A | 11/1995 | Cuomo et al. ............... | 156/345 |
| 5,480,686 A | 1/1996 | Rudder et al. .............. | 427/562 |
| 5,523,121 A | 6/1996 | Anthony et al. ............. | 427/249 |
| 5,626,922 A | 5/1997 | Miyanaga .................... | 427/535 |
| 5,874,014 A | 2/1999 | Robson et al. ................ | 216/68 |
| 5,945,162 A * | 8/1999 | Senateur et al. ............ | 118/725 |

FOREIGN PATENT DOCUMENTS

| | | | |
|---|---|---|---|
| JP | 63-040798 | * 2/1988 | |
| JP | 05-247651 | 9/1993 | ........... C23C/16/26 |

OTHER PUBLICATIONS

*High Performance Polishing Techniques for DVD Diamond*; Final Report (Phase I) Submitted to Naval Air Warfare Center Under Contract No. N68936–93–C–0246, for period 9/93 –12/94, Y. Tommy Tzeng—Principal Investigator, Auburn University.

*Rapid Polishing of Thick Polycrystalline "White" CVD Diamond by Liquid Metal Films*, Article, Department of Electrical Engineering, Auburn University, Y. Tzen, J. Wei, c. Cutshaw, and T. Chein (No date available).

*Polishing of CVD Diamond Film*, Article Elsevier Science Publishers B.V., 1991, Hitoshi Tokura and Masanori Yoshikawa, Faculty of Engineering, Tokyo Institute of Technology (No month available).

(List continued on next page.)

*Primary Examiner*—Timothy Meeks
(74) *Attorney, Agent, or Firm*—Thomas, Kayden, Horstemeyer & Risley, LLP

(57) ABSTRACT

A method of forming diamond crystals and diamond films from a dissociated precursor solution of methanol and at least one carbon containing compound having a carbon to oxygen ration of greater than one is disclosed. The A hot filament is applied to dissociate the vaporized precursor of the premixed solution and generate oxidizing and etching radicals such as OH. O, H as well as carbon depositing radicals such as $CH_3$. Graphitic and amorphous carbon deposition is suppressed or preferentially etched resulting in the net deposition of good quality diamond crystals and diamond films.

16 Claims, 7 Drawing Sheets

OTHER PUBLICATIONS

*Microwave CVD of Diamond Using Methanol–Rare Gas Mixtures*, M. Buck, T.M. Chuang, J.H. Kaufman and H. Seki; Materials Research Society Symp. Proc. vol. 162 (1990) (No month available).

*Applications of Diamond Films and Related Materials*, Y. Tzeng, M. Yoshikawa, M. Murakawa and A. Feldman; Materials Sicence Monographs, 73 (1991) (No month available). Table of Contents Only.

*Synthesis of Diamond in High Power–Density Microwave Methane/Hydrogen/Oxygen plasmas at Elevated Substrate Temperatures*, T. Chein, J. Wei, and Y. Tzeng, Diamond and Related Materials 8, pp. 1686 –1696 (1999) (No month available).

*CVD Diamond Grown by Microwave Plasma in Mixtures of Acetone/Oxygen and Acetone/Carbon Dioxide*, T. Chein and Y. Tzeng, Diamond and Related Materials 8, pp. 1393 –1401 (1999) (No month available).

*Toward a General Concept of Diamond Chemical Vapour Deposition*, P. Bachmann, D. Leers, and H. Lydtin, Diamond and Related Materials 1, pp. 1 –12 (1991) (No month available).

*Diamond Synthesis by the Microwave Plasma CVD Method Using a Mixture of Carbon–Monoxide and Hydrogen Gas*, T. Ito, A. Masuda, Y. Eto, K. Ito, and K. Nishmoto, Science and Technology of New Diamond, pp. 107 –109 (1990) (No month available).

*Diamond Synthesis from Methane—Hydrogen—Water Mixed Gas Using a Microwave Plasma*, Y. Saito, K. Sato, K. Tanaka, K. Fujita and S. Matuda, Hjournal of Materials Science, 23, 842 –846 (1988) (No month available).

*Effects of Oxygen on CVD Diamond Synthesis*, T. Kawato and K. Kondo, Japanese Journal of Applied Physics, pp. 1429 –1432 (1987).

\* cited by examiner

METHOD OF HOT-FILAMENT CHEMICAL VAPOR DEPOSITION OF DIAMOND

This application claims benefit of U.S. Provisional Patent Application No. 60/119,753 filed Feb. 10, 1999, incorporated herein by reference in its entirety.

The invention was made with support from the United States National Aeronautics and Space Administration (Contract No. NASA/NCC5-165) and the United States Department of the Navy (Contract No. Navy/N00014-98-1-0571). The Federal Government may retain certain rights in the invention.

FIELD OF THE INVENTION

The present invention relates to a method of synthesizing diamond. In particular, the present invention relates to a method of synthesizing diamond crystals and diamond films using hot-filament chemical vapor deposition.

BACKGROUND OF THE INVENTION

Diamond synthesized by chemical vapor deposition ("CVD") has many unique and outstanding properties that make it an ideal material a broad range of scientific and technological applications. See Y. Tzeng et al., Application of Diamond, Elsevier Publishers, 1991. A number of methods for diamond CVD are reported which utilize various gas mixtures and energy sources for dissociating the gas mixture. See P. K. Bachmann et al., Diamond and Related Materials 1, 1, (1991). Such methods include the use of high temperature electrons in various kinds of plasma, high solid surfaces on hot filaments, and high temperature gases in combustion flames to dissociate molecules such as hydrogen, oxygen, halogen, hydrocarbon, and other carbon containing gases. Typically, a diamond crystal or film is grown on a substrate, which is usually maintained at a temperature much lower than that of electrons in the plasma, the heated surface of a hot filament, or the combustion flame. As a result, a super equilibrium of atomic hydrogen is developed near the diamond growing surface of the substrate.

Atomic hydrogen is believed to be crucial in the diamond CVD process. It is theorized that atomic hydrogen is effective in stabilizing the diamond growing surface and promoting diamond growth at a CVD temperature and pressure that otherwise thermodynamically favors graphite growth. Consistently, the reported diamond CVD processes involve the use of hydrogen gas or hydrogen containing molecules. The most typical diamond CVD process utilizes a precursor consisting of methane gas diluted by 94–99% hydrogen. With these CVD processes, the super equilibrium of atomic hydrogen can be achieved at a varied percentage of molecular hydrogen in the gas mixture. However, these CVD processes depend on the effectiveness of the dissociation process in generating atomic hydrogen.

Chein et al., Proceedings of the 6th International Conference on New Diamond Science and Technology (1998), report using a high power density microwave plasma to deposit diamond in a precursor consisting of a mixture of methane and hydrogen with less than 50% hydrogen. Growth of diamond from oxy-acetylene flames utilizes a precursor consisting of acetylene and oxygen with a ratio of acetylene to oxygen slightly greater than 1 without additional molecular hydrogen being added. Diamond is deposited in the reducing "inner flame" where atomic hydrogen is a burn product produced by the high temperature flame. In addition to atomic hydrogen, there are plenty of OH radicals present near the diamond growing surface inside the flame. OH and O radicals can play another role of atomic hydrogen in the diamond growth process. That is, preferential etching of non-diamond carbon, which results in a net deposition of high purity diamond. Small quantity of oxygen (0.5–2%) or water vapor (<6%) added to the methane and hydrogen precursor is reported to improve diamond crystallinity and lower the diamond CVD temperature. See Saito et al., Journal of Materials Science, 23, 842 (1988), and Kawato et al., J. Applied Physics, 26, 1429 (1987). The quantity, whether small or large, of oxygen and water in a precursor or feedstock is a relative term depending on many other process parameters. Diamond has also been grown in a microwave plasma of a precursor consisting of an acetone/oxygen mixture with a molecular ratio near 1:1. See Chein et al., Proceedings of the 6th International Conference on New Diamond Science and Technology (1998).

Most of the diamond CVD processes involve the use of one or more compressed gases. Typically, such CVD processes utilize a compressed gas precursor consisting of 1 vol. % methane gas diluted by 99 vol. % hydrogen. These gases usually must be precisely controlled by electronic mass flow controllers to ensure the accurate composition in the gas precursor feed. In U.S. Pat. No. 5,480,686 to Rudder et al. ("Rudder"), a method of diamond growth is disclosed that utilizes a radio frequency ("RF") plasma in a precursor consisting of a mixture of water (more than 40%) and alcohol. No compressed gases are needed for this diamond CVD process. However, water has a low vapor pressure at room temperature, and condensation of water in the cooler part of the reactor manifold may be a concern. Also, water has a high freezing temperature making it easy to freeze at the orifice of a flow controller where liquid vaporizes and enters a low pressure reactor chamber. Further, comparative example 6 of Rudder shows that the hot-filament assisted CVD process using 18 standard cubic cm ("sccm") water and 40 sccm ethanol at 80 Torr at a filament temperature of 2100° C. located about 2 mm from a silicon substrate at 650° C. deposits only fine grain graphite. In contrast Japanese Patent, Kokai Sho 6211987-18006 to Komaki et al. reports the deposition of diamond. This indicates that hot filament can not be used successfully for growing diamond in an atmosphere of high oxygen or water content without special cautions. In a highly oxidizing environment, hot tungsten filaments are simply burned off quickly.

Nevertheless, the hot filament assisted CVD method is desirable because diamond films can be deposited on large-area and/or irregularly shaped objects using inexpensive equipment. Thus, there remains a need for an economic method of synthesizing diamond utilizing hot filament CVD. Further, there remains a need for a method of diamond CVD which employs the benefits of radicals that preferentially etch non-diamond deposits at low substrate temperatures to provide the deposition of high quality diamond. It is to the provision of a method of hot-filament assisted CVD of diamond that meets these needs that the present invention is primarily directed.

SUMMARY OF THE INVENTION

Briefly described, the present invention relates to a method of synthesizing diamond that enables the economic growth of high quality diamond crystals and diamond films using a liquid solution as the feedstock and a hot filament as the means of dissociating and reacting the vapor of the solution. In the method of the present invention, a precursor comprising methanol and at least one carbon containing compound having a carbon to oxygen ratio greater than one is fed into a deposition chamber through a liquid flow controller such as a needle valve. The precursor is a solution comprising 90–99% of methanol and 1–10% of at least one carbon containing compound such as ethanol, isopropanol, and acetone. The precursor is pre-mixed prior to entering the deposition chamber. The solution vaporizes as it enters the low pressure deposition chamber. The vaporized precursor comprises the same composition as the solution. When the vaporized precursor passes a hot filament heated to above 2,000° C., it is dissociated to generate OH, H, O, $CH_3$ and other molecules and radicals.

The substrate generally is sheet or wafer of silicon, copper, aluminum and molybdenum. Additionally, the substrates can be polished using 1 μm diamond paste prior to the deposition process. Typically, the substrate is mounted at a distance, for example, 2 cm, from the hot filament to insure that a desired substrate temperature and composition of radicals transported from near the hot filament are achieved. A spiral tungsten wire of 1.5 mm diameter is passed with 110A 60 Hz electrical current. The reactor chamber pressure is generally maintained at 40 Torr. The silicon substrate of about 25 cm by 2.5 cm is heated by the hot filament to about 600–1000° C. as measured by a dual color optical pyrometer. Diamond is grown at a rate of about 1 μm per hour when 4 grams ethanol, 2.5 grams isopropanol, or 2.5 grams acetone is mixed with 100 grams methanol and used as the precursor.

Various other objects, features and advantages of the present invention will become known to those skilled in the art upon reading the following specification when taken in conjunction with the accompanying drawings.

DETAILED DESCRIPTION

The present invention relates to a method of synthesizing diamond crystals and diamond films for a very broad range of scientific and technological applications such as optical windows, machining tools, heat spreaders, tribological coatings, sensors and actuators, electrochemical coatings, protective coatings, and wide-bandgap semiconductor devices. The method of the present invention uses a premixed methanol-based liquid solution as the feedstock. The methanol-based solution contains a few percentages by weight of one or more carbon containing compounds that have the molar ratio of atomic carbon to atomic oxygen being greater than one. Although water and other compounds that can be dissociated by a high temperature solid surface to form O, H, F, Cl, Br, and OH radicals may be added to the methanol-based solution, it is not a requirement for the deposition of diamond crystals and diamond films by the method of the present invention.

Figure 1:
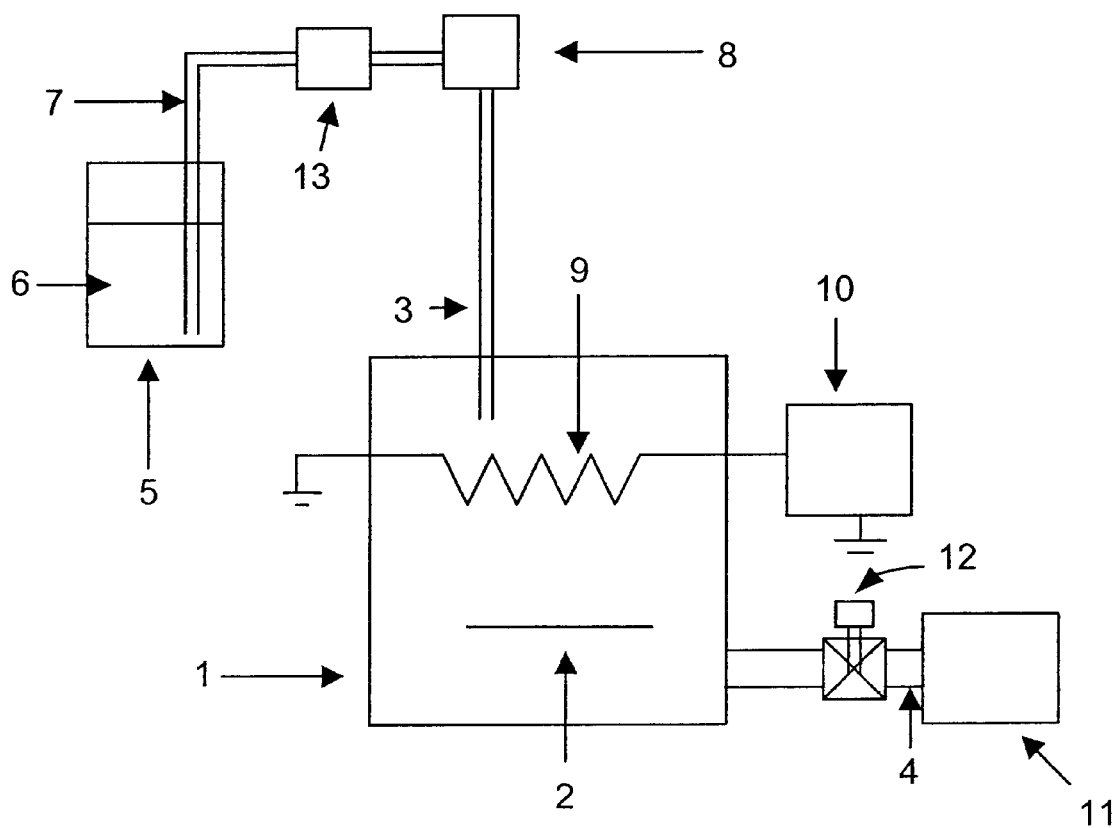
FIG. 1 is a schematic illustration of a hot-filament assisted chemical vapor deposition system made in accordance with the present invention.

Referring to FIG. 1 a hot-filament assisted CVD system utilized in performing the method of the present invention is generally illustrated. A precursor 6 comprising a premixed solution is fed from a precursor container 5 by a conduit 7, and as TEFLON or metal tubing, through a liquid flow controller 8, for example, a needle valve to the inlet 3 of a reactor chamber 1. The reactor chamber 1 is formed from a material capable of withstanding the temperature generated during the CVD process. In the present invention, the reactor chamber 1 is stainless steel and typically 8" in diameter. When the liquid precursor enters the low pressure side of the flow controller 8; it vaporizes to form a vapor mixture with the same molar composition as the pre-mixed precursor. In addition to the inlet 3, the reactor chamber has an outlet 4 connected to a mechanical vacuum pump 11 through an automatically controlled throttle valve 12 to maintain constant pressure in the reactor chamber 1 for circulating the vapor of the methanol-based precursor 6 through the reactor chamber. The vapor precursor 6 is maintained at a pressure within the vacuum chamber of between 1 and 760 torr, with the pressure being monitored by a pressure gauge (not shown). The range of vapor pressure may be raised above 760 torr when a liquid pump 13 is used to pump the liquid precursor 6 through the liquid flow controller 8 into the reactor chamber 1 and the chamber wall is heated to avoid undesired condensation of the vaporized precursor 6 inside the reactor chamber 1. The range of vapor pressure may also be lowered below 1 torr when another vacuum pump (not shown) having a higher throughput or higher vacuum capacity such as a turbomolecular pump is used in addition to the mechanical vacuum pump 11.

A filament 9 comprising tungsten, tantalum, graphite, or other materials of sufficiently high melting point capable of withstanding the temperature of CVD is heated to a sufficiently high temperature so that the vapor of the precursor 6 is dissociated to produce etchant radicals and carbon containing radicals for diamond deposition. Typically, the deposition zone is maintained at a temperature between 200° to 1600° C. and at a pressure between 1 mtorr and 10 atmospheres. Further, an electrical current is passed through a filament, plurality of filaments, or sheets of carbon or metals with melting points higher than 2,200° C. so that a solid surface is heated to greater than 2000° C. In the present invention, a tungsten filament 9 of 1.5 mm in diameter and having a spiral shape of about 2.5 cm in diameter is utilized. A variable alternate current (AC) power supply 10 feeds 110 A of current at 60 Hz through the filament 9 to heat it well above 2000° C. The vapor precursor 6 is fed into the reactor chamber 1 to reach a desired deposition vapor pressure before the filament 9 is heated to its maximum operating temperature. The condition is optimized so that there is a small net deposition of carbon on the filament 9 in order to prevent the filament 9 from being oxidized and eroded by the etching radicals produced from the vapor precursor 6.

A substrate 2 is positioned at a distance of about 2 cm from the hot filament 9 at a reactor pressure of 40 torr. The hot filament 9 heats the substrate 2 to a temperature between 800° C. and 1000° C. In the present invention, temperature is determined with a dual color optical pyrometer (not shown). Although not required, the substrate 2 can be polished with 1 mm size diamond paste, a 2.5 cm by 2.5 cm silicon wafer of (100) orientation was polished and placed on a substrate holder (not shown) with three stainless steel spacers (not shown) between the substrate 2 and substrate holder (not shown). Spacers are used to decrease heat conduction and increase the temperature of the substrate 2. The optimal distance between the substrate 2 and the filament 9, and the proper means of thermally managing the substrate 2 temperature vary with the reactor vapor pressure, the filament temperature, and the composition of the vapor.

The hot tungsten filament 9 dissociates vapor precursor 6 and releases OH, H, O, $CH_3$, $CH_2$ ... etc. radicals for a net deposition of diamond on the substrate 2. Methanol vapor ($CH_3$ OH). has a carbon to oxygen ratio equal to one. When methanol vapor is dissociated, it forms an excess of oxidizing radicals such that, there is not a net deposition of diamond on the substrate 2. Instead, the tungsten filament 9 is oxidized and eroded, causing the deposition of some non-diamond materials on the substrate 2. When an appropriate quantity of a carbon containing compound with carbon to oxygen ratio greater than 1 is added to methanol to form the precursor 6, a net deposition of diamond on the substrate 2 and the prevention of the etching of the tungsten are achieved. Ethanol ($CH_3CH_2OH$) has a carbon to oxygen ratio of 2. Isopropanol, $(CH_3)_2CHOH$) has the carbon to oxygen ratio of 3. Acetone is ($CH_3COCH_3$) has a carbon to oxygen ratio of 3. Further, if it is desired for the diamond to contain a dopant, the carbon containing compound can comprises dopant elements or moieties in addition to C, O, and H, such as boron, phosphorus, silicon, etc. Such dopants include, but are not limited to, halides, metals, and the like.

The substrate can comprise any suitable material conventionally utilized in CVD processes. Useful substrate materials are capable of withstanding the temperatures generated during the plasma process. Examples of such substrates include, but are not limited to, a sheet or wafer of silicon, copper, aluminum, molybdenum, and alloys thereof. Further, the substrate may be either unseeded or seeded with diamond crystallites. Seeding can be accomplished by polishing the diamond growing surface of the substrate with diamond paste containing diamond particles, such as 1 $\mu$m particles.

In experiments conducted using the method of the present invention, the CVD process lasted for 10–14 hours and resulted in diamond films with well faceted diamond grains clearly visible using an optical microscope. The diamond grain size was from a few micrometers to about 10 mm in size. This indicates that the diamond growth rate was in the order of about 1 mm per hour.

A hot-filament assisted chemical vapor deposition technique using methanol-based solution precursors as the feedstock has been developed for the deposition of diamond crystals and diamond films. The OH, H, O radicals generated by the dissociation of the methanol-based vapor are shown to be sufficient in suppressing the growth of graphitic and amorphous carbon resulting in the net deposition of diamond by the carbon containing radicals that were dissociated from the same vapor. By the addition of a few weight percentage of carbon containing compounds with carbon to oxygen ratio greater than one to the methanol, the erosion of the hot tungsten filament by the strongly oxidizing and etching radicals released from the vapor after being dissociated by the hot filament was prevented.

The methanol-based solution precursor is much less expensive than the typical compressed gases that are typically used for diamond deposition. The mixing of the methanol-based solution precursor can be easily performed in a laboratory under standard conditions, making it unnecessary to use expensive precision electronic mass flow controllers. Being able to apply the method of the hot filament assisted chemical vapor deposition of the present invention to the methanol-based solution precursor is also highly desirable because of the capability of this method in depositing diamond films on large-area and/or irregularly shaped objects.

When methanol alone was used as the feedstock, too much oxidation of the hot filament resulted in the gradually reduction of the filament diameter. No diamond was deposited on the substrate. When too much of ethanol, isopropanol, or acetone was added to methanol, graphite tends to coat the hot filament leading to the swelling of the hot filament. When the substrate is placed too close to the hot filament, the etchant radical concentration at the substrate surface was too high and no deposition was observed. By properly optimizing the composition of the solution, the filament temperature, the distance between the filament and the substrate, the vapor pressure, and the substrate temperature, good quality diamond films as indicated by a sharp Raman peak near 1332 $cm^{-1}$ and nicely faceted diamond grains seen through an optical microscope have been achieved using liquid feedstock without any compressed gas.

EXAMPLES

A. Substrate Pre-treatment and Cleaning.

A 4" single-side polished silicon (100) wafer was first cut into 1"×1" dies. The dies were scratched with diamond paste containing 1 mm diamond paricles. The scratched silicon dies were cleaned by acetone and methanol before being loaded onto the substrate holder. No further substrate treatment and cleaning were performed.

B. Deposition Parameters.

Deposition parameters for the examples below are as follows:

Tungsten filament, was of 1.5 mm in diameter. Alternate current (AC) of 110 A at 60 Hz was passed through the filament. The vapor pressure was maintained at 40 torr. The premixed methanol-based solution was fed into the reactor chamber through a needle valve at a rate approximately equal to 20 cubic centimeters per hour. The substrate was placed at a distance of 2 cm from the hot filament. The substrate temperature was measured to be between 800° C. and 1000° C. by means of a dual color optical pyrometer. The reflection of light from the hot filament by the silicon surface may have interfered with the temperature measurement to some extent and caused the temperature measurement to be non-uniform when viewing the substrate from different directions using the pyrometer. The measured substrate temperature may be an overestimation of the actual bulk temperature of the silicon substrate. The deposition period is about 10 hours resulting in diamond films on the order of 10 $\mu$m in thickness.

C. Diamond Film Characterization Methods.

Figure 2:
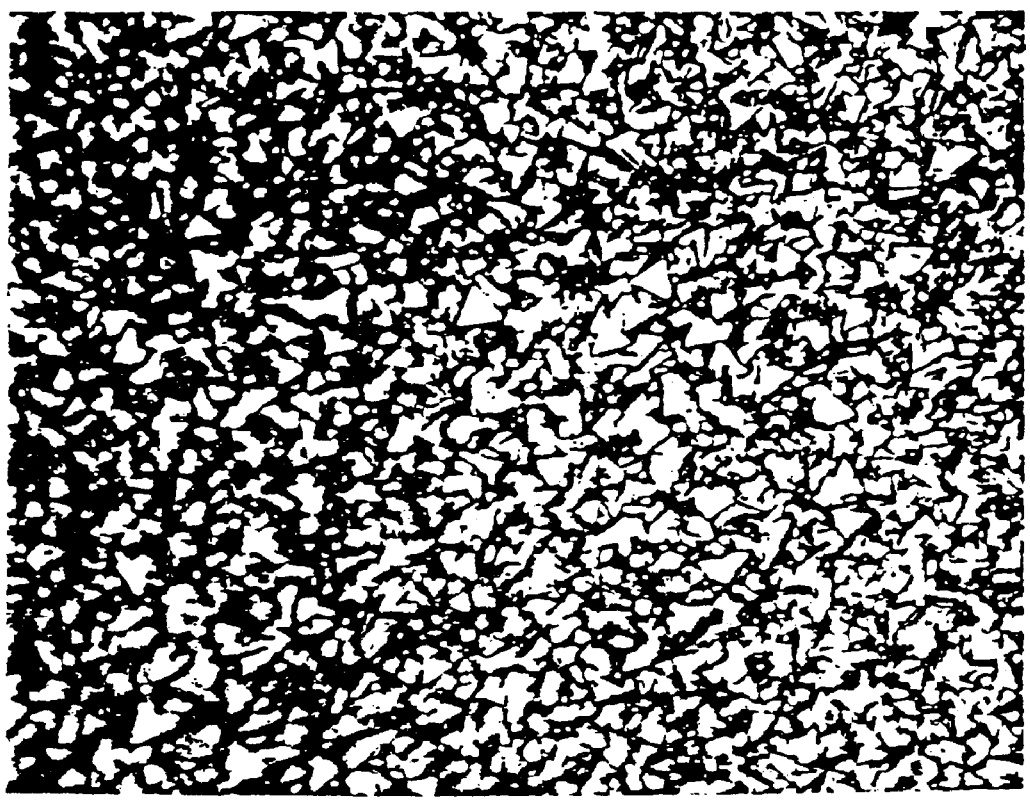
FIG. 2 is an optical micrograph of a diamond film deposited in accordance with the present invention on silicon in a vapor of a solution comprising of 4 grams of ethanol diluted by 100 grams of methanol.
Figure 3:
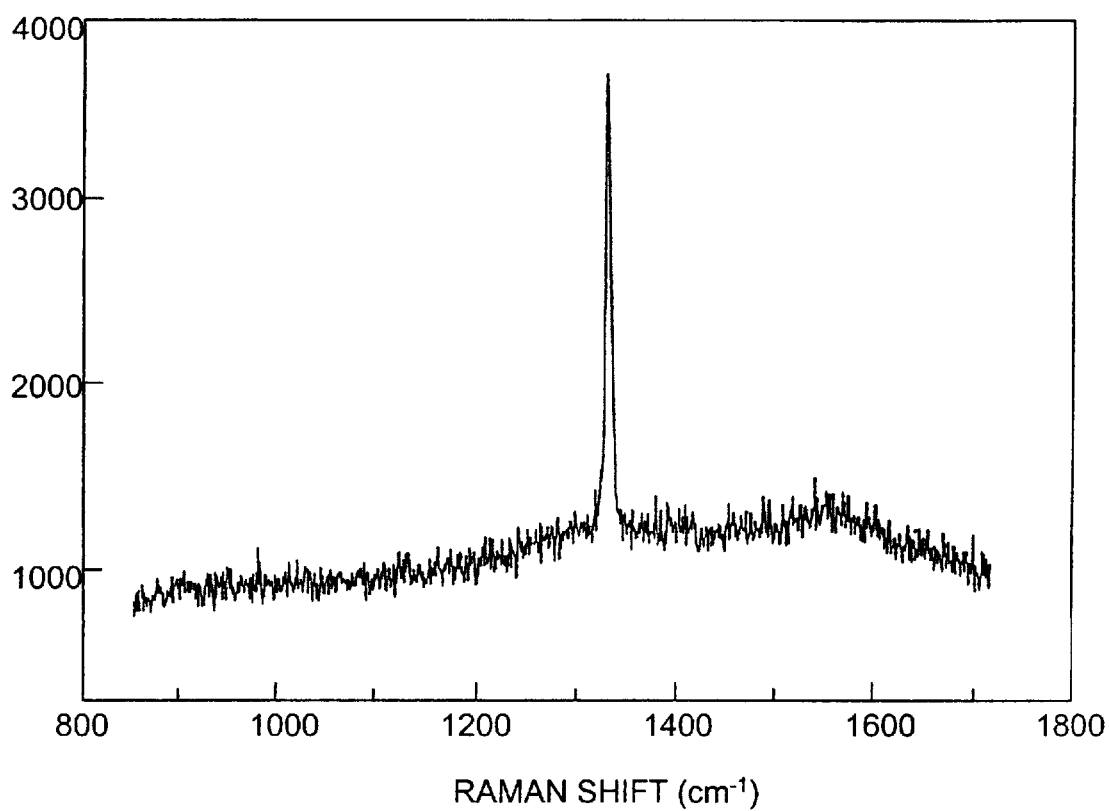
FIG. 3 is a graphic illustration of a Raman spectrum for the diamond film of FIG. 2.
Figure 4:
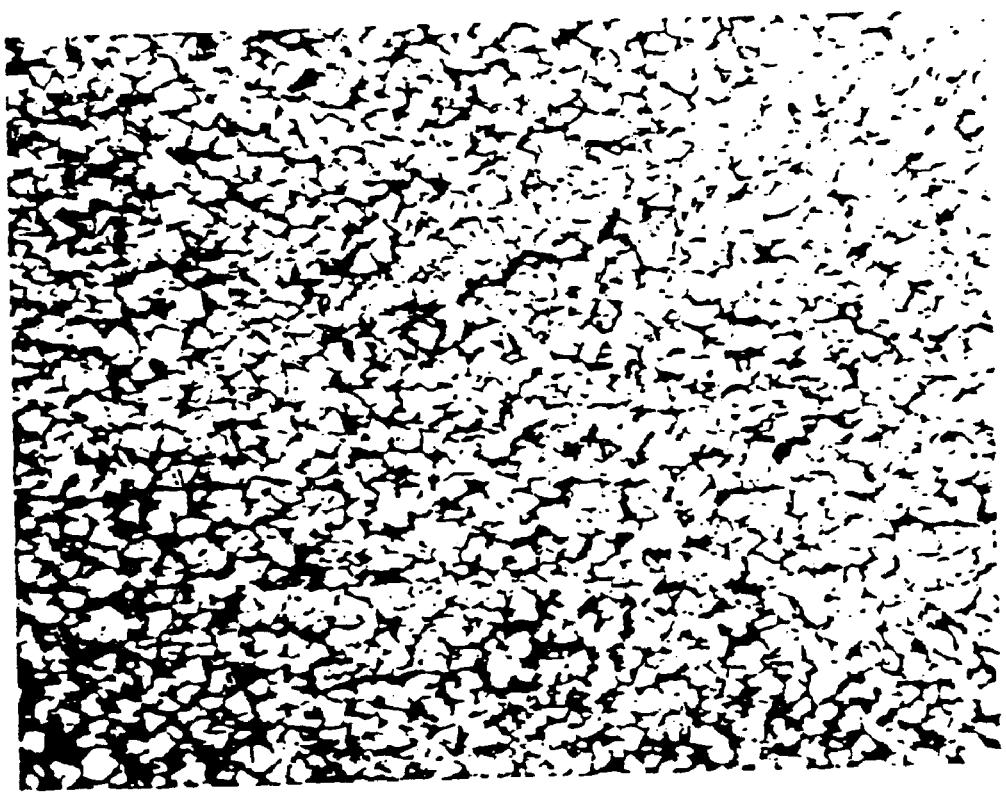
FIG. 4 is an optical micrograph of a diamond film deposited in accordance with the present invention on silicon in a vapor of a solution comprising 2.5 grams of isopropanol diluted by 100 grams of methanol.
Figure 5:
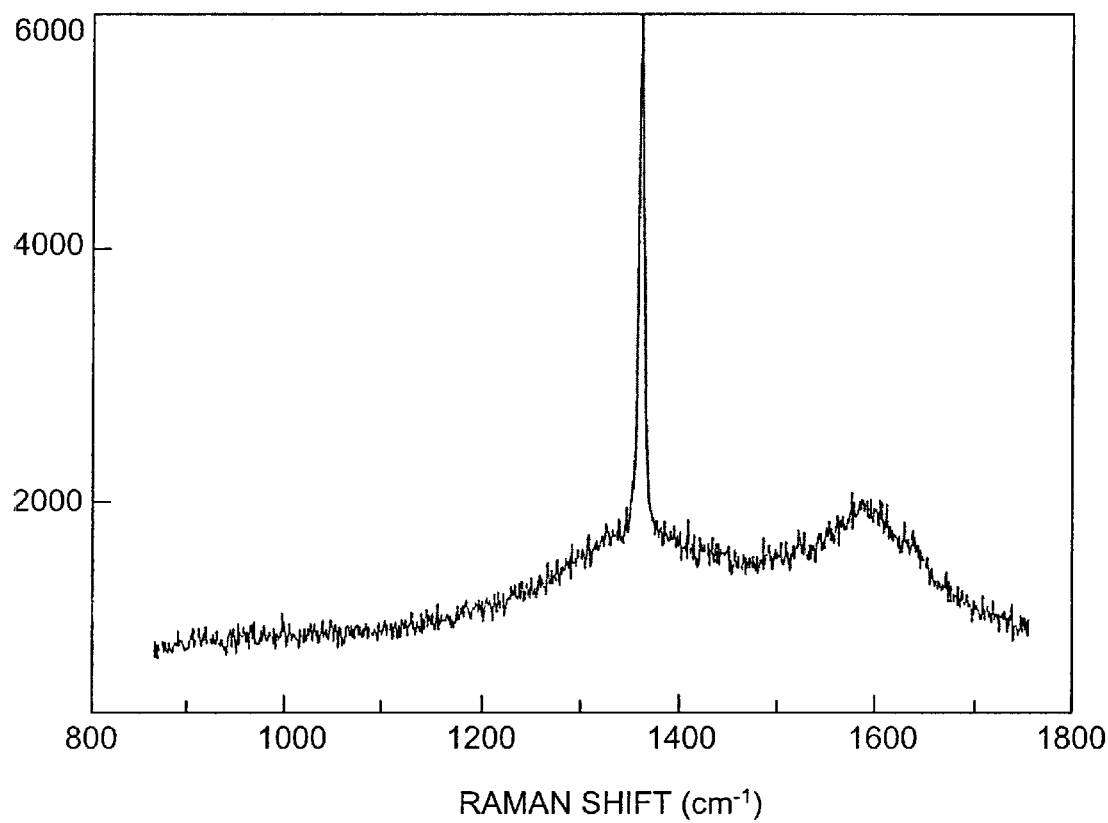
FIG. 5 is a graphic illustration of a Raman spectrum for the diamond film of FIG. 4.
Figure 6:
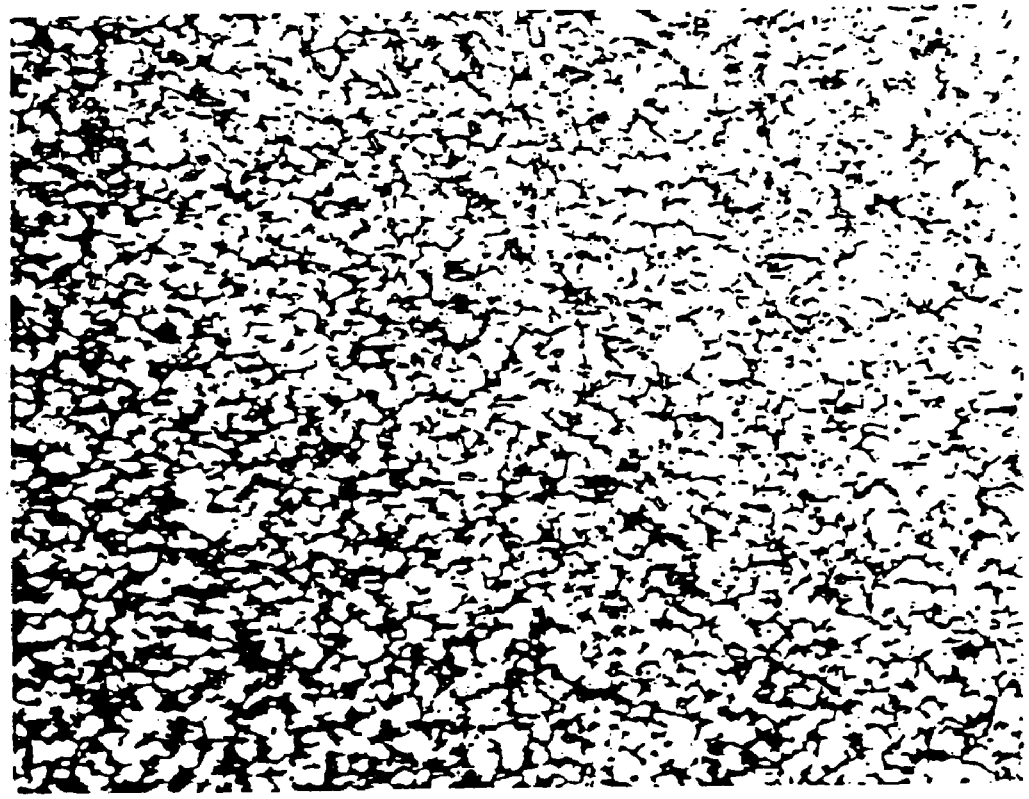
FIG. 6 is an optical micrograph of a diamond film deposited in accordance with the present invention on silicon in a vapor of a solution comprising 2.5 grams of acetone diluted by 100 grams of methanol.
Figure 7:
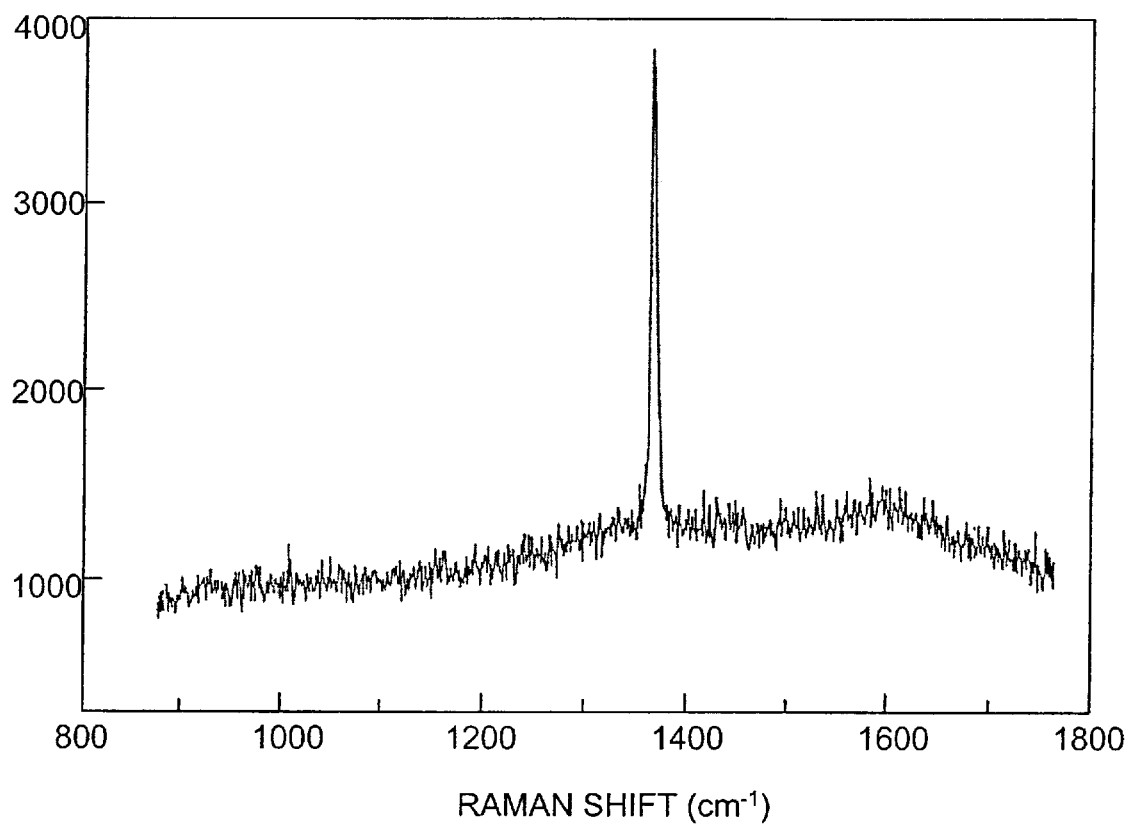
FIG. 7 is a graphic illustration of a Raman spectrum for the diamond film of FIG. 6.

An optical microscope was used to examine the crystal shapes and surface morphology of the deposited films. Diamond grains with 100 or 111 facets can clearly be seen using the optical microscope. The optical micrographs shown in FIGS. 2, 4 and 6 were taken with a magnification of 500 times. The film thickness can also be measured by examining the cross-sectional view of the films using the same optical microscope. A micro Raman spectrometer powered by an Argon ion laser was used to examine the phase purity and crystallinity of the deposited films and the spectrums are illustrated in FIGS. 3, 5, and 7. Diamond peak around 1332 $cm^{-1}$ provided convincing evidence that the deposited films were diamond.

The following examples are provided to illustrate the present invention, but are not to be construed as limiting the invention in any way.

Example 1

The methanol-based precursor was made by mixing 4 grams of ethanol with 100 grams of methanol. Other experimental parameters were the same as that described in the Section of Deposition parameters. FIG. 2 shows the optical micrograph of the deposited diamond film. A diamond film with well faceted diamond grains can be clearly seen in FIG. 4. Raman spectrum shown in FIG. 3 clearly indicates that a sharp diamond peak at around 1332 cm$^{-1}$ is present and the deposited diamond film is of good quality.

Example 2

The methanol-based solution precursor was made by mixing 2.5 grams of isopropanol with 100 grams of methanol. Other experimental parameters were the same as that described above. FIG. 4 shows the optical micrograph of the deposited diamond film. A diamond film with well faceted diamond grains can be clearly seen. Raman spectrum shown in FIG. 5 clearly indicates that a sharp diamond peak at around 1332 cm$^{-1}$ is present and the deposited diamond film is of good quality. The broad band around 1560 cm$^{-1}$ indicates that this specific diamond film also contains some amorphous carbon in addition to the crystalline diamond.

Example 3

Mixing 2.5 grams of acetone with 100 grams of methanol made the methanol-based solution precursor. Other experimental parameters are the same as that described above. FIG. 6 shows the optical micrograph of the diamond film. A diamond film with well faceted diamond grains can be clearly seen in FIG. 6. Raman spectrum shown in FIG. 7 clearly indicates that a diamond peak at around 1332 cm$^{-1}$ is present and the diamond film is of good quality.

It will be understood by those skilled in the art that while the present invention has been disclosed with reference to preferred embodiment described above, various modifications, additions and changes can be made thereto without departing from the spirit and scope of the present invention.

What is claimed is:

1. A method of forming diamond crystals or a diamond film comprising:
    disposing a substrate in a reaction chamber;
    introducing a liquid precursor consisting essentially of methanol and at least one carbon and oxygen containing compound having a carbon to oxygen ratio greater than one into an inlet of the reaction chamber;
    vaporizing the liquid precursor; and
    subjecting the vaporized precursor to a hot filament under conditions effective to disassociate the vaporized precursor and promote diamond growth on the substrate.

2. The method according to claim 1, wherein methanol is present in the liquid precursor in an amount between about 90 wt. % and about 99 wt. % of the liquid precursor.

3. The method according to claim 1, wherein the at least one carbon and oxygen containing compound is present in the liquid precursor in an amount between about 1 wt. % to about 10 wt. %.

4. The method according to claim 1, wherein the at least one carbon and oxygen containing compound is selected from the group consisting of ethanol, isopropanol, acetone, and combinations thereof.

5. The method according to claim 1, wherein the subjecting a vaporized precursor step is conducted at a pressure between about 1 torr and 760 torr.

6. The method according to claim 1, wherein the substrate is heated to a temperature between about 600° C. to about 1,000° C.

7. The method according to claim 1, wherein the hot filament is heated to a temperature of at least about 2,000° C.

8. The method according to claim 1, wherein the substrate comprises a sheet or wafer of silicon, copper, aluminum, molybdenum, or alloys thereof.

9. The method according to claim 1, wherein the hot filament is a tungsten filament.

10. A methanol-based method for chemical vapor deposition of diamond crystals and diamond films on surfaces of a substrate, comprising:
    providing an apparatus including an inlet, a disassociation zone including a hot filament, a deposition zone and an outlet;
    introducing a liquid precursor consisting essentially of methanol and at least one carbon and oxygen containing compound having a carbon to oxygen ratio greater than one, into the inlet at a sufficient flow rate so that the liquid precursor is vaporized and flows through the disassociation zone, past the deposition zone, and through the outlet, wherein the liquid precursor constitutes by weight percentage no more than 99% of methanol;
    disassociating the vaporized precursor by subjecting the vaporized precursor to the hot filament and reacting the vaporized precursor as the vaporized precursor flows or diffuses through the disassociation zone to produce OH, H, O, and carbon containing radicals; and
    transporting the carbon containing radicals to the substrate in the deposition zone to produce the diamond crystals or diamond films on the surface of the substrate.

11. The process according to claim 10, wherein the disassociation and reacting steps comprise:
    passing the vaporized precursor close to or directly at a solid surface that is heated to a sufficiently high temperature for disassociating the vaporized precursor in the disassociation zone.

12. The process according to claim 11, further comprising:
    passing an electrical current through a filament, filaments, or sheets of carbon or metals with melting points higher than 2,200° C. so that a solid surface is heated to greater than 2000° C.

13. The process according to claim 10, wherein the liquid precursor contains between about 90 wt % to about 99 wt. % methanol.

14. The process according to claim 13, further comprising:
    supplementing methanol with the at least one carbon and oxygen containing compound having carbon, hydrogen, and oxygen with the atomic ratio of carbon to oxygen being greater than one.

15. The process according to claim 14, wherein the carbon and oxygen containing compound is selected from the group consisting of isopropanol, acetone, and combinations thereof.

16. The process according to claim 11, wherein the deposition zone is maintained at a temperature between 200° C. to 1600° C. and at a pressure between 1 mtorr and 10 atmospheres.

* * * * *